(12) United States Patent
Kita et al.

(10) Patent No.: US 11,208,977 B2
(45) Date of Patent: Dec. 28, 2021

(54) IGNITION CONTROL DEVICE AND REFERENCE VOLTAGE ADJUSTMENT METHOD OF IGNITION CONTROL DEVICE

(71) Applicant: Hitachi Automotive Systems, Ltd., Hitachinaka (JP)

(72) Inventors: Masato Kita, Hitachinaka (JP); Yoichiro Kobayashi, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 133 days.

(21) Appl. No.: 16/485,217

(22) PCT Filed: Jan. 24, 2018

(86) PCT No.: PCT/JP2018/002076
§ 371 (c)(1),
(2) Date: Aug. 12, 2019

(87) PCT Pub. No.: WO2018/159161
PCT Pub. Date: Sep. 7, 2018

(65) Prior Publication Data
US 2019/0360448 A1    Nov. 28, 2019

(30) Foreign Application Priority Data
Mar. 1, 2017    (JP) .............................. JP2017-038073

(51) Int. Cl.
*F02P 3/05* (2006.01)
*G01R 19/165* (2006.01)
(Continued)

(52) U.S. Cl.
CPC .......... *F02P 3/05* (2013.01); *G01R 19/16533* (2013.01); *G05F 1/56* (2013.01); *H03K 17/567* (2013.01)

(58) Field of Classification Search
CPC ... F02P 3/05; F02P 17/12; F02P 3/053; G01R 19/16533; G01R 1/203; G01R 19/16576;
(Continued)

(56) References Cited

U.S. PATENT DOCUMENTS

| | | | | |
|---|---|---|---|---|
| 3,320,439 A | * | 5/1967 | Widlar | G05F 3/30 |
| | | | | 327/530 |
| 4,275,701 A | * | 6/1981 | Arguello | F02P 3/0435 |
| | | | | 123/146.5 A |

(Continued)

FOREIGN PATENT DOCUMENTS

| JP | S63-239368 A | 10/1988 |
|---|---|---|
| JP | H9-257840 A | 10/1997 |
| JP | 2013-242245 A | 12/2013 |

OTHER PUBLICATIONS

Wikipedia.org; Widlar current source; Jan. 31, 2011; Figure 1 (Year: 2011).*

(Continued)

*Primary Examiner* — Phutthiwat Wongwian
*Assistant Examiner* — Susan E Scharpf
(74) *Attorney, Agent, or Firm* — Foley & Lardner LLP (57) ABSTRACT

To provide an ignition control device of an internal combustion engine capable of reducing the number of adjustment steps required for adjustment such as matching of a MOS gate voltage or the like without being affected by device variation. A detection voltage is generated on the basis of a primary current flowing through a current detection resistor having a positive temperature dependent characteristic. A reference voltage is generated by a potential difference between a base and an emitter of a first bipolar transistor circuit and a multiple type second bipolar transistor circuit in which a plurality of bipolar transistors are connected in parallel, and a resistance value of a first resistor connected to the emitter side of the plurality of the bipolar (Continued)

transistor circuit, on the basis of a current having a positive temperature dependent characteristic similar to the current detection resistor.

3 Claims, 4 Drawing Sheets

(51) Int. Cl.
    *G05F 1/56*     (2006.01)
    *H03K 17/567*     (2006.01)

(58) Field of Classification Search
    CPC ....... G01R 19/16571; G05F 1/56; G05F 1/10; H03K 17/567; H03K 17/0828; H03K 17/145
    See application file for complete search history.

(56) References Cited

U.S. PATENT DOCUMENTS

| | | | | |
|---|---|---|---|---|
| 4,899,715 A * | 2/1990 | Koiwa | ............ | F02P 3/051 |
| | | | | 123/644 |
| 5,775,310 A * | 7/1998 | Ito | ............ | F02P 3/0552 |
| | | | | 123/630 |
| 5,819,713 A * | 10/1998 | Kesler | ............ | F02P 3/0552 |
| | | | | 123/630 |
| 5,910,737 A * | 6/1999 | Kesler | ............ | F02P 17/12 |
| | | | | 327/52 |
| 6,194,884 B1 * | 2/2001 | Kesler | ............ | G05F 3/222 |
| | | | | 323/285 |
| 6,668,811 B1 * | 12/2003 | Kesler | ............ | F02P 3/051 |
| | | | | 123/609 |
| 2001/0037801 A1 * | 11/2001 | Ito | ............ | F02P 3/04 |
| | | | | 123/644 |
| 2004/0084034 A1 * | 5/2004 | Huberts | ............ | F02P 3/045 |
| | | | | 123/630 |
| 2004/0084035 A1 * | 5/2004 | Newton | ............ | G01L 23/225 |
| | | | | 123/630 |
| 2005/0178372 A1 * | 8/2005 | Kesler | ............ | F02P 3/055 |
| | | | | 123/630 |
| 2006/0244496 A1 * | 11/2006 | Kawakita | ............ | F02P 11/06 |
| | | | | 327/110 |
| 2013/0279067 A1 * | 10/2013 | Yamada | ............ | F02P 3/04 |
| | | | | 361/253 |
| 2016/0265501 A1 * | 9/2016 | Miyazawa | ............ | H03K 17/567 |
| 2017/0338737 A1 * | 11/2017 | Kohama | ............ | F02P 3/0552 |
| 2019/0245328 A1 * | 8/2019 | Nodake | ............ | G01R 19/0092 |

OTHER PUBLICATIONS

International Search Report with English translation and Written Opinion issued in corresponding application No. PCT/JP2018/002076 dated Mar. 20, 2018.

* cited by examiner

IGNITION CONTROL DEVICE AND REFERENCE VOLTAGE ADJUSTMENT METHOD OF IGNITION CONTROL DEVICE

TECHNICAL FIELD

The present invention relates to an ignition control device for an internal combustion engine that applies a high voltage to a spark plug provided in the internal combustion engine, and more particularly to an ignition control device including a current limiting circuit for limiting a current flowing through a primary side of an ignition coil, and a reference voltage adjustment method for the ignition control device.

BACKGROUND ART

In an ignition control device that applies a high voltage to a spark plug provided in an internal combustion engine, a current limiting circuit is provided for limiting a current on a primary side of an ignition coil to a predetermined value and preventing an excessive abnormal current from flowing. Such a current limiting circuit is well known as disclosed in, for example, JP 2013-242245 A (PTL 1). In PTL 1, when a current value of a primary current flowing between a transistor that controls a primary current of an ignition coil and a detection resistor exceeds a predetermined value, the driving of the transistor is controlled by a drive circuit, and an excessive primary current is prevented from flowing through the primary side of the ignition coil.

A current detection circuit included in a current limiting circuit compares a voltage value of a voltage generated by the primary current flowing in the detection resistor with a reference voltage value so as to detect the magnitude relationship between a current value of the primary current and a threshold current of the current limiting circuit (reference current value). Note that the reference voltage value is generated corresponding to the reference current value so that the current value of the primary current and the reference current value are compared.

CITATION LIST

Patent Literature

PTL 1: JP 2013-242245 A

SUMMARY OF INVENTION

Technical Problem

By the way, although a detection resistor for detecting a primary current is composed of a detection resistor made of a metal material (generally made of aluminum), the resistance value of the metal detection resistor is small expressed in units of milliohm. This metal detection resistor generally has a "positive" temperature dependent characteristic, and the resistance value varies with temperature change. The magnitude of the voltage generated by the primary current flowing through the detection resistor varies depending on the change in temperature even if the magnitude of the primary current is the same due to this "positive" temperature dependent characteristic. In this way, since the detection resistor has a "positive" temperature dependent characteristic, the detection voltage also has a "positive" temperature dependent characteristic.

In order to deal with this temperature dependent characteristic, the reference voltage to be compared also made to have a temperature dependent characteristic so that the detection error of the primary current can be prevented. In PTL 1, the temperature dependent characteristic of the ON resistor of a MOS transistor is utilized in order to make the reference voltage have the temperature dependent characteristic.

However, since the ON resistor of the MOS transistor is directly affected by "device variation" of the MOS transistor, matching by adjustment of the gate voltage of the MOS transistor (resistor trimming) or the like is necessary, and a problem arises such as an increase in the unit price of a product due to addition of the number of extra adjustment steps.

An object of the present invention is to provide a novel ignition control device capable of reducing the number of adjustment steps required for adjustment such as matching of the MOS gate voltage or the like without being affected by "device variation", and a reference voltage adjustment method of the ignition control device.

Solution to Problem

A feature of the present invention resides in including ignition control means that drives a switching element for controlling a current flowing through a primary side coil of an ignition coil, the ignition control means including a current limiting circuit that controls a switching element to limit a current flowing through the primary side coil when a detection voltage exceeds a reference voltage, the current limiting circuit including a detection voltage generation unit that generates the detection voltage corresponding to a primary current flowing through the primary side coil, a reference voltage generation unit that generates a reference voltage corresponding to a reference current, and a comparison unit that compares a magnitude relationship between the detection voltage and the reference voltage, in which the detection voltage is generated in the detection voltage generation unit on the basis of the primary current flowing through a current detection resistor having a "positive" temperature dependent characteristic made of a metal material, and the reference voltage is generated by a potential difference (proportional to a thermal voltage VT) between a base and an emitter of a first bipolar transistor circuit and a multiple type second bipolar transistor circuit in which a plurality of bipolar transistors are connected in parallel, and a resistance value of a first resistor connected to the emitter side of the second bipolar transistor circuit, and is generated in the reference voltage generation unit on the basis of a current having a "positive" temperature dependent characteristic similar to the current detection resistor.

Advantageous Effects of Invention

According to the present invention, since a reference voltage is determined by a specific accuracy of a bipolar transistor, it is possible to reduce the number of adjustment steps such as matching of a MOS gate voltage without being affected by "device variation" and suppress an increase in the unit price of a product.

DESCRIPTION OF EMBODIMENTS

Hereinafter, embodiments of the present invention will be described in detail with reference to the drawings. However, the present invention is not limited to the following embodiments, and various modifications and application examples also fall within the range in the technical concept of the present invention.

First Embodiment

Figure 1:
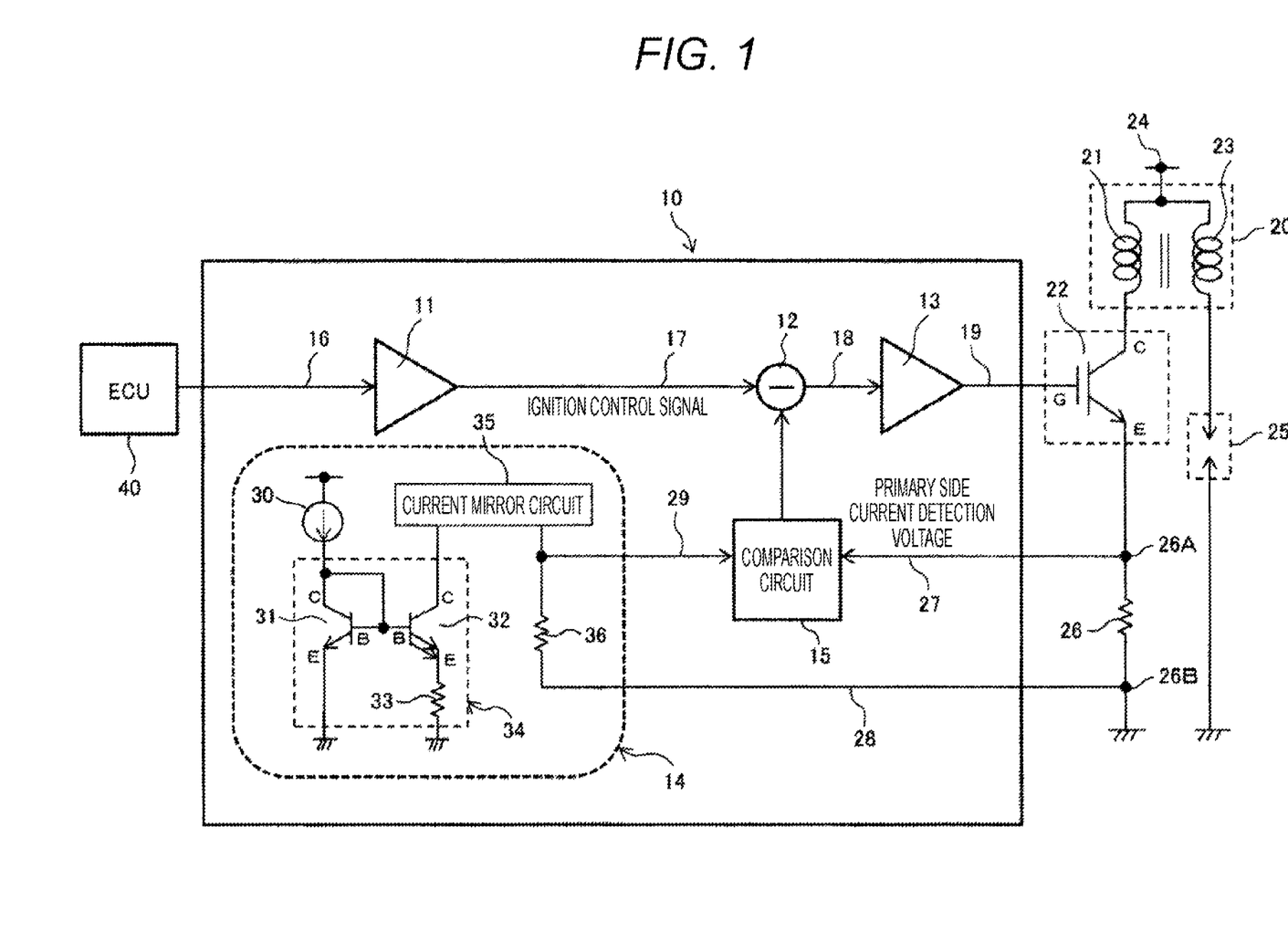
FIG. 1 is a circuit diagram showing a configuration of an ignition control device of an internal combustion engine according to a first embodiment of the present invention.

FIG. 1 shows a circuit configuration of an ignition control device of an internal combustion engine according to a first embodiment of the present invention.

An ignition control signal from a main control means (hereinafter, referred to as an electronic control unit (ECU)) 40 is input to a control device 10 that functions as ignition control means for driving a switching element 22 for controlling a current flowing through a primary side coil 21 of an ignition coil 20, and a primary current of the ignition coil 20 is controlled by the ignition control signal.

The control device 10 basically includes an input buffer circuit 11, a level subtraction circuit 12, an output buffer circuit 13, a reference voltage generation circuit 14, a comparison circuit 15, and the like. The ECU and the input buffer circuit 11 are connected by a signal line 16, the input buffer circuit 11 and the level subtraction circuit 12 are connected by a signal line 17, and the level subtraction circuit 12 and the output buffer circuit 13 are connected by a signal line 18.

The output buffer circuit 13 outputs an ignition control signal to a gate G of a transistor 22 that controls a primary current flowing through the primary side coil 21 of the ignition coil 20 by the signal line 19. The ignition coil 20 includes the primary side coil 21 and the secondary side coil 23, and electric power is supplied from a battery 24. The secondary side coil 23 of the ignition coil 20 is connected to a spark plug 25 and applies the high voltage generated in the secondary side coil 23 to the spark plug 25 to ignite the air-fuel mixture in a cylinder.

A collector C of the transistor 22 is connected to the primary side coil 21, and an emitter E is grounded via a current detection resistor 26. One end 26A of the current detection resistor 26 is connected to a comparison circuit 15 by a signal line 27 and another end 26B of the current detection resistor 26 is connected to the reference voltage generation circuit 14 by a signal line 28. A metal resistor such as aluminum is used for the current detection resistor 26. Note that details of the reference voltage generation circuit 14, which is a feature of the present embodiment, will be described later.

In the above configuration, in the normal ignition operation, the ignition control signal input from the ECU 40 to the control device 10 by the signal line 16 is output from the signal line 19 via the input buffer circuit 11 and the output buffer circuit 13, and drives the transistor 22 of a power system such as an insulated gate bipolar transistor (IGBT) that is a switching element. When the transistor 22 is turned on, a current flows through the primary side coil 21 of the ignition coil 20.

Next, at the same time that the transistor 22 is turned off, a primary voltage is generated in the primary side coil 21, a secondary voltage corresponding to the winding ratio is generated in the secondary side coil 23 due to the mutual induction effect, and the voltages are supplied to the spark plug 25. As a result, the air-fuel mixture in the cylinder is ignited and combustion is started.

Next, a case where a current limiting function of the ignition coil primary side coil 21 is operated will be described. When the transistor 22 is turned on and a current flows through the primary side coil 21 of the ignition coil 20, this current is converted into a voltage by the current detection resistor 26 and input to the ignition control device 10 by the signal line 27. In the control device 10, the detection voltage from the signal line 27 and the reference voltage from a signal line 29 of the reference voltage generation circuit 14 are compared by the comparison circuit 15.

When the detection voltage is higher than the reference voltage, the comparison circuit 15 transmits the comparison result to the level subtraction circuit 12 to lower the control voltage level of the transistor 22 to lower the current value of the current flowing through the primary side coil 21 of the ignition coil 20. Specifically, the voltage level of the normal ignition control signal from the signal line 17 is set to the voltage reduced by the level subtraction circuit 12, and the transistor 22 is driven via the output buffer 13 with the ignition control signal of the reduced voltage level.

Here, in order to accurately compare the reference voltage and the detection voltage in the comparison circuit 15, the ground terminal of the current detection resistor is unified as a reference potential, and the ground terminal of the reference voltage generation circuit 14 is connected to this reference potential by the signal line 28.

Since a large current flows through the primary side coil 21 of the ignition coil 20, the resistance value of the current detection resistor 26 is small, and is in the unit of milliohm, and therefore, the primary side coil 21 is realized by a metal resistor made of a metal material such as a bonding wire. For this reason, the temperature dependent characteristic of the metal resistor is increased. The sign of the temperature coefficient of the metal resistor is "positive", the resistance value rises on the high temperature side and the resistance value decreases on the low temperature side, and accordingly the detection voltage value also has a similar temperature dependent characteristic. Therefore, it is necessary to apply the temperature dependent characteristic corresponding to the temperature coefficient of the current detection resistor 26 also to the reference voltage.

Therefore, in the present embodiment, the reference voltage generation circuit 14 shown in FIG. 1 is proposed. FIG. 1 shows the reference voltage generation circuit 14 having a "positive" temperature dependent characteristic that is the same tendency as that of the current detection resistor 26 consisting of a metal resistor.

The reference voltage generation circuit 14 of the present embodiment includes: an NPN type bipolar transistor (single bipolar transistor) 31 connected to a current source 30; a multiple type bipolar transistor circuit 32 in which NPN type bipolar transistors are connected in parallel by a predetermined number (plural); a Widlar constant current circuit 34 consisting of a resistor (first resistor) 33 connected to an emitter E of the multiple type bipolar transistor circuit 32; and a circuit that generates a reference voltage in a resistor (second resistor) 36 after mirroring of a current generated in the Widlar constant current circuit 34 with a current mirror circuit 35.

A reference voltage is generated between the current mirror circuit 35 and the resistor 36, and the reference voltage is supplied to the comparison circuit 15 via the signal line 29. Accordingly, the comparator 15 can compare the reference voltage with the detection voltage.

In the bipolar transistor 31 and the multiple type bipolar transistor circuit 32 included in the Widlar constant current circuit 34, a voltage difference ($\Delta VBE$) is generated between the voltages between the base B and the emitter E (VBE). This voltage difference ($\Delta VBE$) has a temperature dependent characteristic and corresponds to the thermal voltage (VT). Therefore, a current is generated by the voltage on the emitter E side of the multiple type bipolar transistor 32 circuit corresponding to the voltage difference ($\Delta VBE$), and the resistor 33 connected between the emitter E side and the ground.

This current has a "positive" temperature dependent characteristic, and is in proportion to the thermal voltage (VT), and also the reference voltage obtained by the current flowing into the resistor 33 has a proportional value to the thermal voltage (VT), that is, the absolute temperature (T). The above relationship is expressed by the following equation.

First, the detection voltage at an arbitrary temperature detected by the current detection resistor 26 having the "positive" temperature dependent characteristic can be expressed by the following equation (1). Here, when the detection voltage at the reference temperature (T0) is set to (VD0), the detection voltage at an arbitrary temperature (Ta) is set to (VDa), and the temperature coefficient of the current detection resistor 26 is set to ($\alpha$), the detection voltage obtained from the current flowing through the current detection resistor 26 satisfies $VDa = VD0 \times \{1 + \alpha(Ta - T0)\}$ (1) Note that the current detection resistor 26 is a metal resistor made of, for example, aluminum or copper and has a value of about $\alpha \approx 4 \times 10^{-3}$ [/° C.].

Next, the reference voltage (VSL) having the "positive" temperature dependent characteristic generated by the reference voltage generation circuit 14 can be expressed by the following equation (2). Here, when the resistance value of the resistor 33 is set to (R33), the resistance value of the resistor 36 is set to (R36), the mirror ratio of the current mirror circuit 35 is set to (M) times, the number ratio of the bipolar transistor 31 and the multiple type bipolar transistor circuit 32 is set to (N) times, and the thermal voltage is set to $(VT = k \times T/q)$, $VSL = M \times (R36/R33) \times \ln(N) \times k \times T/q$ (2) is satisfied. Here, k is the Boltzmann constant, q is the electronic charge, and T is the absolute temperature.

The reference voltage at an arbitrary temperature generated in the reference voltage generation circuit 14 obtained by the above-described equation (2) can be expressed by the following equation (3). Here, when the reference voltage at the reference temperature (T0) is set to (VSL0) and the reference voltage at an arbitrary temperature (Ta) is set to (VSLa), as in the above expression (1), $VSLa = VSL0 \times \{1 + (1/(T0+273)) \times (Ta - T0)\}$ (3) is satisfied.

When temperature of 27° C. is set as the reference, the value $(1/(T0+273))$ corresponding to the temperature coefficient $\alpha 0$ in the equation (1) satisfies $1/300 = 3.3 \times 10^{-3}$ [/° C.]. Here, the absolute temperature (T) and the thermal voltage (VT) have a proportional relationship to each other. As the equation (2), the resistance ratio between the resistor 33 and the resistor 36, the mirror ratio of the current mirror circuit 35, and the number ratio of the bipolar transistors 31, 32 are reflected to the reference voltage (VSL).

Accordingly, the reference voltage generation circuit 14 of the present embodiment can adjust at least one of the number of the bipolar transistors included in the multiple type bipolar transistor circuit, the mirror ratio of the current mirror circuit, and the resistance ratio between the first resistor and the second resistor to output a reference voltage having a temperature dependent characteristic falling within a predetermined error range with respect to the temperature dependent characteristic of the current detection resistor.

As described above, the reference voltage generation circuit of the present embodiment outputs a reference voltage having a temperature dependent characteristic falling within a predetermined error range with respect to the temperature dependent characteristic of the current detection resistor made of a metal material. For this reason, it is possible to apply a temperature dependent characteristic that is the same extent as the detection voltage to the reference voltage to suppress an error in current detection.

As described above, since the reference voltage is determined depending on the number of the bipolar transistors, the mirror ratio of the current mirror circuit, and the resistance ratio between the first resistor and the second resistor, the reference voltage depends only on the variation of the specific accuracy of the device, so that adjustment steps such as trimming are not necessary and a stable reference voltage can be obtained. In the present embodiment, it is desirable to use a plurality of bipolar transistors of the same shape arranged in parallel in order to increase the specific accuracy. In the present embodiment, the number ratio of the multiple type bipolar transistors 32 is used to adjust the temperature dependent characteristic of the reference voltage.

Figure 2:
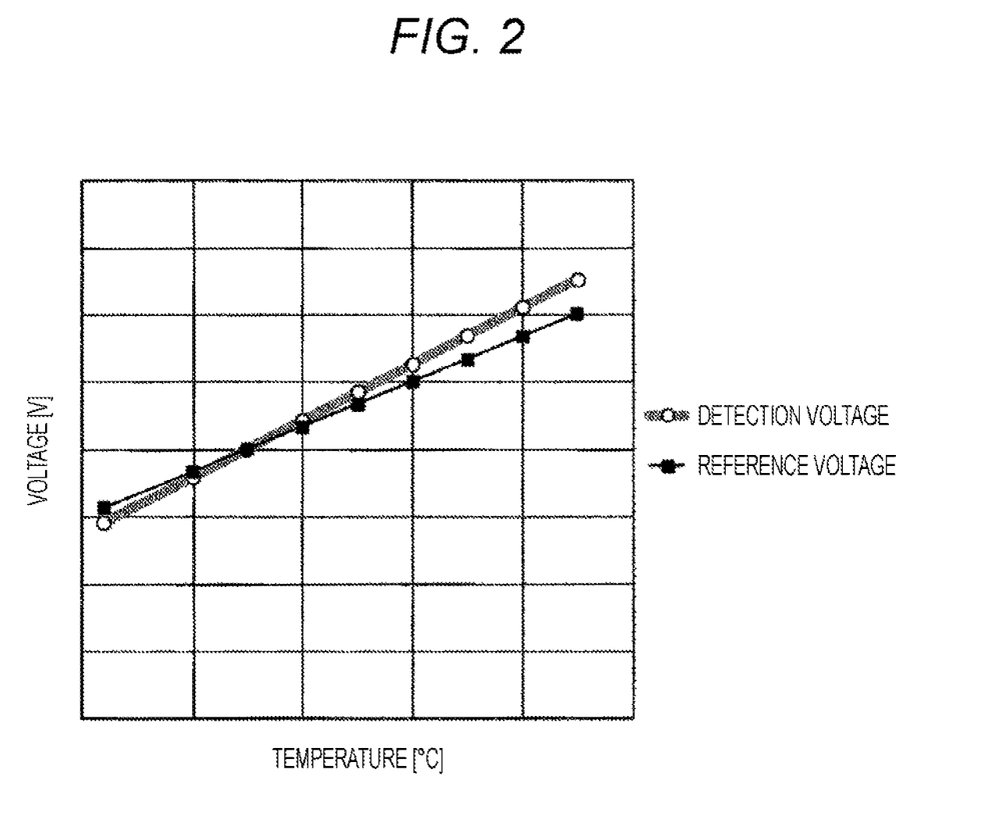
FIG. 2 is a characteristic diagram showing temperature dependent characteristics of a detection voltage and a reference voltage of the ignition control device shown in FIG. 1.

FIG. 2 shows the temperature dependent characteristic of the detection voltage and the reference voltage of the ignition control device shown in FIG. 1, and the detection voltage and the reference voltage are shown with the horizontal axis representing temperature and the vertical axis representing voltage. The "positive" (+) temperature coefficient of the detection voltage by the current detection resistor 26 is about $4 \times 10^{-3}$ [/° C.], and the "positive" (+) temperature coefficient of the reference voltage of the reference voltage generation circuit 14 is about $3.3 \times 10^{-3}$ [/° C.]. In this way, if a temperature dependent characteristic can be applied to the reference voltage of the reference voltage generation circuit 14 according to the temperature dependent characteristic of the current detection resistor 26, the error of current detection can be suppressed.

Second Embodiment

Figure 3:
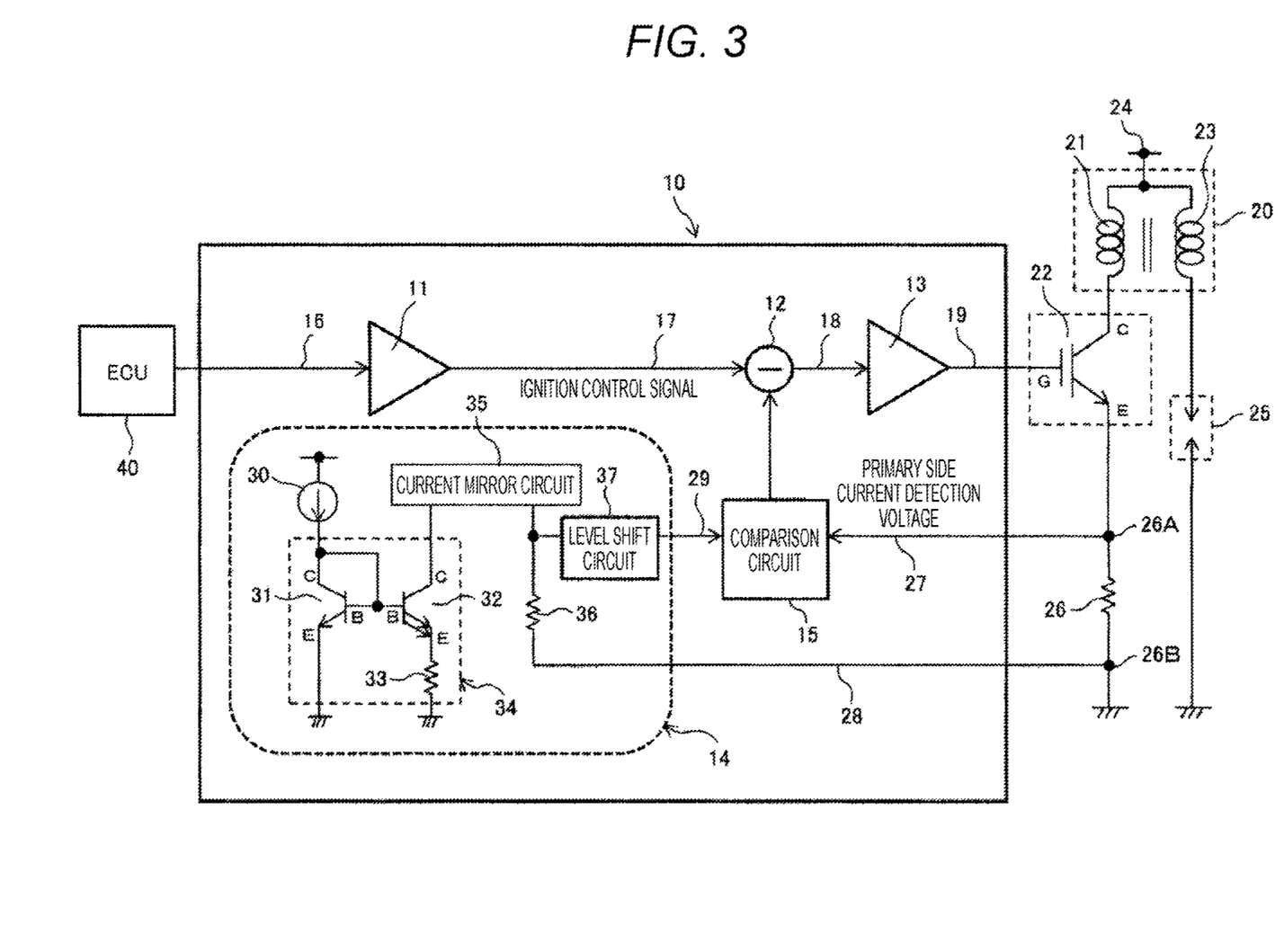
FIG. 3 is a circuit diagram showing a configuration of an ignition control device of an internal combustion engine according to a second embodiment of the present invention.

Next, a second embodiment of the present invention will be described. In the second embodiment, a level shift circuit is added to the reference voltage generation circuit 14. Addition of this level shift circuit can further reduce the error in current detection and improve the detection accuracy. Note that the same reference numerals as those in FIG. 1 denote the same constituent elements, and redundant description will not be repeated.

In FIG. 3, a level shift circuit 37 is interposed in the middle of the signal line 29 connecting between the current mirror circuit 35 and the resistor 36, and the comparison circuit 15. The level shift circuit 37 has a function of adjusting the reference voltage corresponding to the temperature in an increasing direction or a decreasing direction without changing its inclination.

In the first embodiment, the detection voltage of the current detection resistor 16 and the temperature coefficient of the reference voltage of the reference voltage generation circuit 14 do not coincide with each other, so that their inclination are different. Therefore, when the voltage values of both are matched at the reference temperature, the inclination characteristics with respect to temperature do not coincide with each other. When the inclination characteristics with respect to temperature are matched, the voltage values do not coincide with each other at the reference temperature.

Therefore, in the present embodiment, after the inclination characteristic with respect to the temperature of the reference voltage is adjusted to coincide with the detection voltage, the reference voltage is further shifted by the level shift circuit 37 so that the temperature dependent characteristics can be matched.

Figure 4:
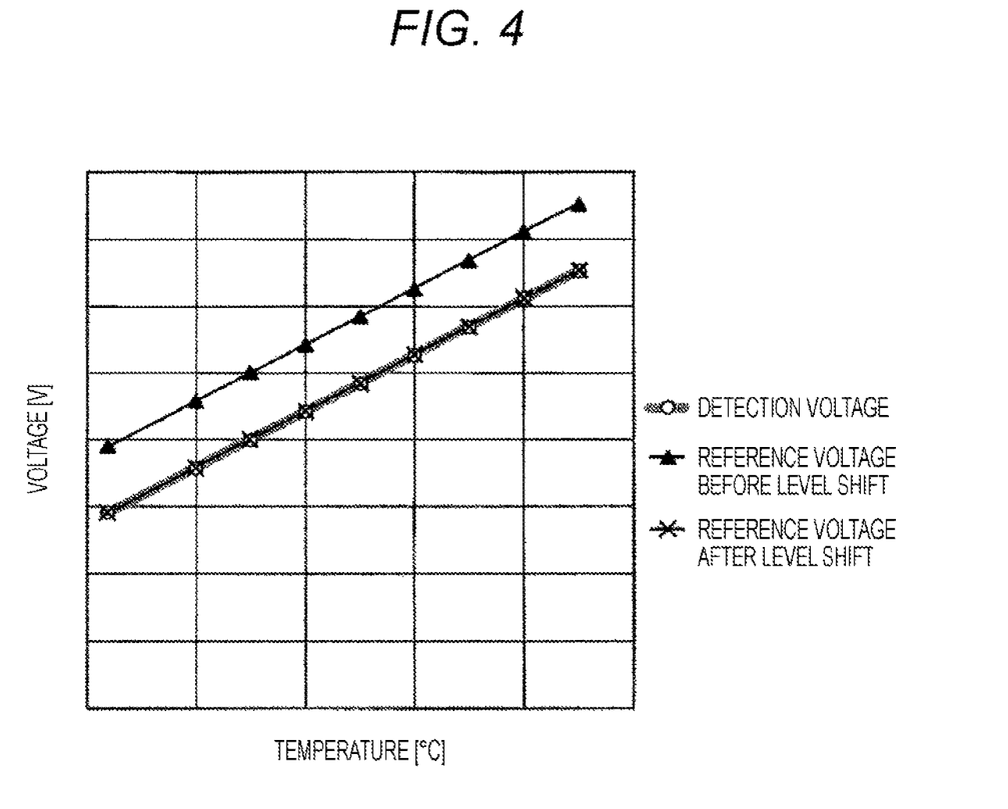
FIG. 4 is a characteristic diagram showing temperature dependent characteristics of a detection voltage and a reference voltage of the ignition control device shown in FIG. 3.

FIG. 4 shows the temperature dependent characteristics of the detection voltage and the reference voltage of the ignition control device shown in FIG. 3, and the detection voltage and the reference voltage are shown with the horizontal axis representing temperature and the vertical axis representing voltage. As shown in FIG. 2, if the temperature dependent characteristics are different between the detection voltage and the reference voltage, the detection accuracy tends to be worse as the difference from the reference temperature increases.

On the other hand, as shown in FIG. 4, after the inclination of the temperature dependent characteristic is adjusted by changing the circuit constant or the like, the reference voltage value is uniformly shifted by the level shift circuit 37, so that the temperature dependent characteristic of the reference voltage can be matched with the temperature dependent characteristic of the detection voltage. Addition of this level shift circuit can further reduce the error in current detection and improve the detection accuracy.

Further, in the present embodiment, it is described that the reference voltage is generated by a potential difference between a single bipolar transistor and a plurality of bipolar transistors. However, when the number of bipolar transistors denoted as plural with respect to the bipolar transistor denoted as single is large, the voltage difference ($\Delta VBE$) required in the present invention can be obtained.

As described above, according to the present invention, the detection voltage is generated by the detection voltage generation unit on the basis of the primary current flowing through the current detection resistor having the "positive" temperature dependent characteristic formed by a metal material, and the reference voltage is generated by a potential difference (proportional to a thermal voltage VT) between a base and an emitter of the first bipolar transistor circuit and the multiple type second bipolar transistor circuit in which a plurality of bipolar transistors are connected in parallel, and a resistance value of a first resistor connected to the emitter side of the second bipolar transistor circuit, and is generated in the reference voltage generation unit on the basis of a current having a "positive" temperature dependent characteristic similar to the current detection resistor.

According to this, since a reference voltage value is determined by a specific accuracy of a bipolar transistor, it is possible to eliminate adjustment steps such as matching of a MOS gate voltage without being affected by "device variation" and suppress an increase in the unit price of a product.

Note that the present invention is not limited to the embodiments described above, and various modifications are included. Each of the embodiments described above has been described in detail in order to explain the present invention in an easy-to-understand manner, and the present invention is not necessarily limited to those having all the configurations described in the embodiments. A part of the configuration of one embodiment can be replaced by the configuration of another embodiment, and the configuration of another embodiment can be added to the configuration of one embodiment. With respect to part of the configuration of each embodiment, other configurations can be added, deleted, or replaced.

REFERENCE SIGNS LIST 10 ignition control device
11 input buffer circuit
12 level subtraction circuit
13 output buffer circuit
14 reference voltage generation circuit
15 comparison circuit
16, 17, 18, 19 signal line
20 ignition coil
21 primary side coil
22 transistor
23 secondary side coil
25 spark plug
26 current detection resistor
27, 28, 29 signal line
30 current source
31, 32 bipolar transistor
33, 36 resistor
35 current mirror circuit
37 level shift circuit
40 control means (ECU)

The invention claimed is:

1. An ignition controller that drives a switch for controlling a current flowing through a primary side coil of an ignition coil, the ignition controller comprising a current limiter configured to control the switch to limit the current flowing through the primary side coil when a detection voltage exceeds a reference voltage, the current limiter including:
   a detection voltage generator that generates the detection voltage corresponding to a primary current flowing through the primary side coil,
   a reference voltage generator that generates the reference voltage corresponding to a reference current, the reference voltage generator comprising:
      a current mirror circuit;
      a first bipolar transistor circuit having a collector side connected to a current source;
      a multiple type second bipolar transistor circuit including:
         a larger number of bipolar transistors than the first bipolar transistor circuit,
         a collector side connected to one side of the current mirror circuit, and
         a base side connected to a base side of the first bipolar transistor circuit;
      a Widlar constant current circuit consisting of a first resistor connected to an emitter side of the multiple type second bipolar transistor circuit; and
      a second resistor connected to another side of the current mirror circuit, wherein the first bipolar transistor circuit includes at least one bipolar transistor that is the same as a bipolar transistor of the multiple type second bipolar transistor circuit, wherein the ignition controller is configured to adjust a plurality of characteristics to be set for the reference voltage generator to output the reference voltage, the plurality of characteristics including:
- a number of bipolar transistors including the first bipolar transistor circuit and the multiple type second bipolar transistor circuit,
- a mirror ratio of the current mirror circuit, and
- a resistance ratio between the first resistor and the second resistor, wherein the reference voltage has a temperature dependent characteristic falling within a predetermined error range with respect to a temperature dependent characteristic of the current detection resistor, a comparator configured to compare a magnitude relationship between the detection voltage and the reference voltage, wherein the detection voltage is generated in the detection voltage generation unit on the basis of the primary current flowing through a current detection resistor having a positive temperature dependent characteristic formed of a metal material, wherein the reference voltage is generated by all of:
- a potential difference proportional to a thermal voltage VT, the potential difference being between a base and an emitter of a first bipolar transistor circuit;
- the potential difference between a base and an emitter of a multiple type second bipolar transistor circuit, wherein a plurality of bipolar transistors are connected in parallel in the multiple type second bipolar transistor circuit; and
- a resistance value of a first resistor connected to the emitter side of the multiple type second bipolar transistor circuit, wherein the reference voltage is generated in the reference voltage generator on the basis of a current having a positive temperature dependent characteristic similar to the current detection resistor; and wherein a positive temperature coefficient of the detection voltage by the current detection resistor is about $4 \times 10^{-3}/°$ C., and a positive temperature coefficient of the reference voltage of the reference voltage generator is about $3.3 \times 10^{-3}/°$ C.

2. The ignition controller according to claim 1, further comprising:
a level shifter configured to adjust the level of the reference voltage from the reference voltage generator, the level shifter provided between the reference voltage generator and the comparator.

3. A reference voltage adjustment method of an ignition controller that drives a switch for controlling a current flowing through a primary side coil of an ignition coil, the ignition controller comprising a current limiter configured to control the switch to limit a current flowing through the primary side coil when a detection voltage exceeds a reference voltage, the current limiter including:
- a detection voltage generator that generates the detection voltage corresponding to a primary current flowing through the primary side coil detected by a current detection resistor made of a metal,
- a reference voltage generator that generates the reference voltage corresponding to a reference current, and
- a comparator configured to compare a magnitude relationship between the detection voltage and the reference voltage, wherein the reference voltage generator includes:
- a current mirror circuit,
- a first bipolar transistor circuit having a collector side connected to a current source,
- a multiple type second bipolar transistor circuit including:
  - a larger number of bipolar transistors than the first bipolar transistor circuit,
  - a collector side connected to one side of the current mirror circuit, and
  - a base side connected to a base side of the first bipolar transistor circuit,
- a Widlar constant current circuit consisting of a first resistor connected to the emitter side of the multiple type second bipolar transistor circuit, and
- a second resistor connected to another side of the current mirror circuit, wherein the first bipolar transistor circuit includes at least one bipolar transistor that is the same as a bipolar transistor of the multiple type second bipolar transistor circuit, wherein the ignition controller is configured to adjust at least one of a plurality of characteristics for the reference voltage generator to output the reference voltage, the plurality of characteristics being at least one of:
- the number of the bipolar transistors composing the first bipolar transistor circuit and the multiple type second bipolar transistor circuit,
- a mirror ratio of the current mirror circuit, and
- a resistance ratio between the first resistor and the second resistor, wherein the reference voltage has a temperature dependent characteristic falling within a predetermined error range with respect to a positive temperature dependent characteristic of the current detection resistor, wherein the current detection resistor is made of a metal, and wherein a positive temperature coefficient of the detection voltage by the current detection resistor is about $4 \times 10^{-3}/°$ C., and a positive temperature coefficient of the reference voltage of the reference voltage generator is about $3.3 \times 10^{-3}/°$ C.

* * * * *